United States Patent [19]
Rich

[11] 3,957,371
[45] May 18, 1976

[54] LOCATOR PIN FOR ALIGNING PRINTED CIRCUIT BOARD WITH ARTWORK
[75] Inventor: Dennis E. Rich, Phoenix, Ariz.
[73] Assignee: Honeywell Information Systems, Inc., Phoenix, Ariz.
[22] Filed: July 2, 1975
[21] Appl. No.: 592,566

[52] U.S. Cl. .......................... 355/74; 101/DIG. 12; 118/504
[51] Int. Cl.² ........................................ G03B 27/58
[58] Field of Search .......... 118/504, 505, 503, 406, 118/301; 355/93, 72–75, 78, 125, 126; 101/DIG. 12; 24/73 SP; 83/451

[56] References Cited
UNITED STATES PATENTS
| | | | |
|---|---|---|---|
| 2,418,228 | 4/1947 | Haff | 355/75 |
| 3,000,737 | 9/1961 | Barnhart | 101/DIG. 12 |
| 3,028,786 | 4/1962 | Wanielista et al. | 101/DIG. 12 |
| 3,178,984 | 4/1965 | Barothy | 83/698 X |

FOREIGN PATENTS OR APPLICATIONS
2,418,228  4/1947

Primary Examiner—Morris Kaplan
Attorney, Agent, or Firm—Walter W. Nielsen

[57] ABSTRACT

A locator pin is provided as part of an apparatus for maintaining accurate registration between a circuit board on which a conductive pattern is to be formed and a printing mask containing the image of the conductive pattern. The locator pin comprises a base member, an upright body member having a plurality of annularly arranged slots therein, and a threaded expansion pin fitting into the body member. The body member has a first cross-sectional area when the expansion pin is not screwed into it and a second cross-sectional area when the expansion pin is forcibly screwed into it. The first cross-sectional area of the body member is less than that of registration holes in the circuit board and printing mask, permitting the circuit board to be easily positioned adjacent the printing mask. The second cross-sectional area is at least as great as that of the registration holes so that the circuit board and printing mask are interlocked in accurate registration with one another.

2 Claims, 4 Drawing Figures

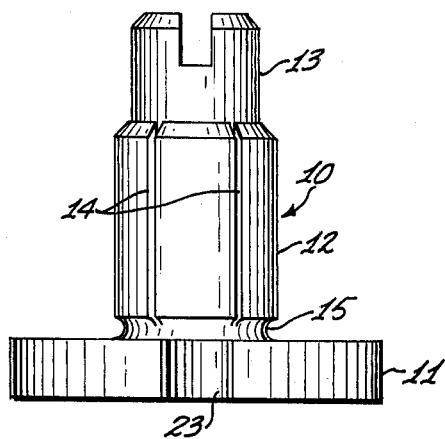
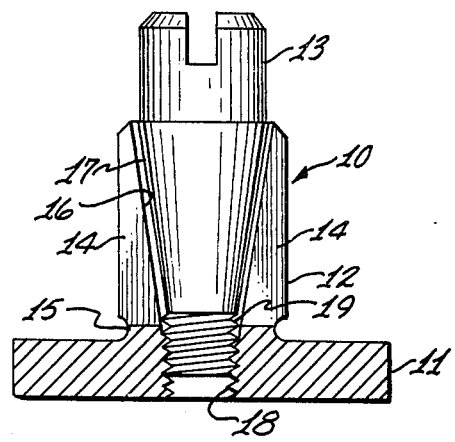
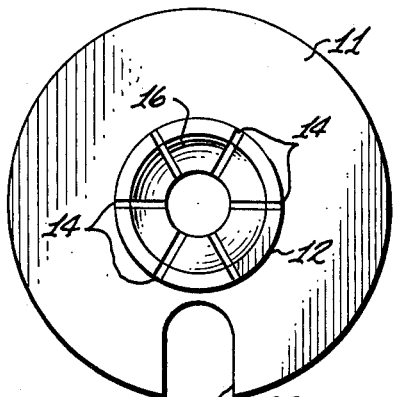
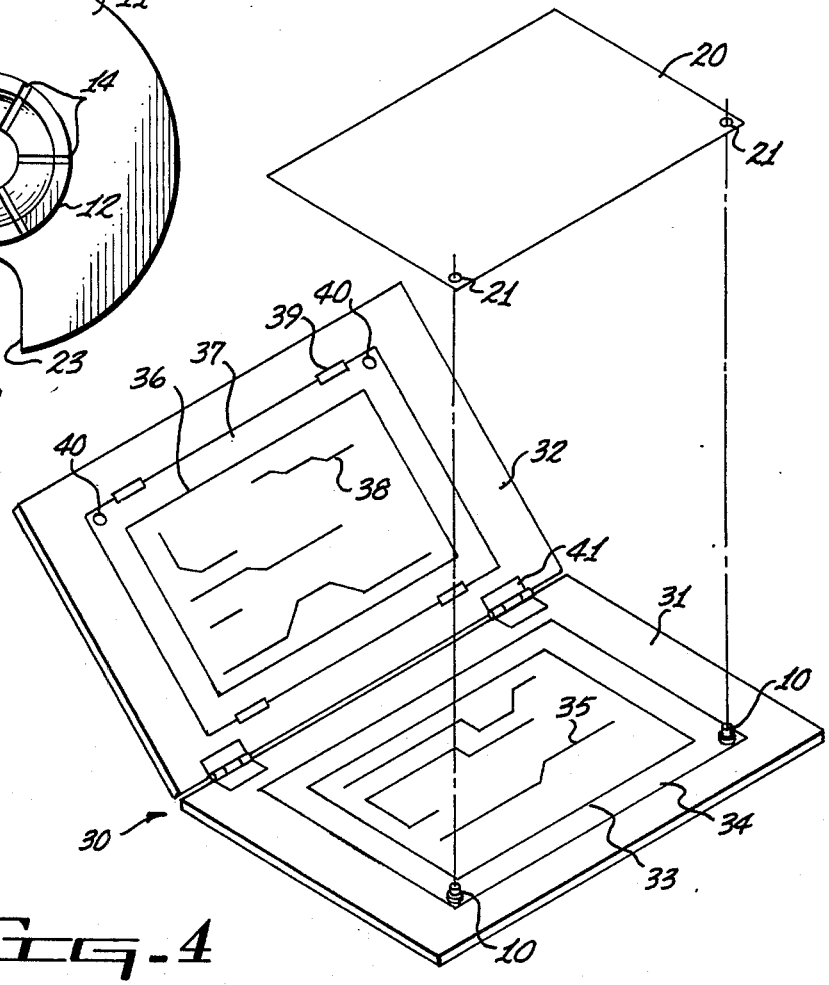

LOCATOR PIN FOR ALIGNING PRINTED CIRCUIT BOARD WITH ARTWORK

BACKGROUND OF THE INVENTION

This invention relates generally to apparatus for making printed circuit boards and, more particularly, to apparatus for maintaining precise registration between a circuit board and a printing mask containing the image of a conductive pattern to be printed on the circuit board.

It is known in the technology for fabricating printed circuit boards to utilize a mechanized circuit board printing device comprising a closed loop conveyor having a plurality of print frames disposed at regular intervals along it, a loading/unloading station where an unexposed, copper-plated and photoresist-coated circuit board is secured to the print frame which contains a printing mask for exposing a desired conductive circuit pattern on the circuit board photoresist and where an exposed circuit board is removed from the print frame, and an exposure station where a controlled light source forms a latent image of the conductive pattern of the printing mask on the circuit board photoresist. As this mechanized circuit board printing equipment is relatively expensive, it is desirable to obtain as high a throughput of exposed circuit boards as possible without jeopardizing the quality of the boards.

Regarding the aforementioned prior art mechanized printer, it has been found that disadvantages associated with the means for maintaining registration between the circuit board and the printing mask have been a major factor in contributing to a relatively low throughput value. In the past it has been customary to employ for this purpose either two locator pins situated at opposite ends of the print frame or four locator pins situated at each side of the frame. The locator pins pass through special bushings in the glass print frame and then pass through corresponding holes in the circuit board. The use of square locator pins has not been found to be practical, as square pins require corresponding square bushings in the glass artwork, which bushings are difficult to maintain to close tolerances and are expensive to manufacture. Moreover, square locator pins have a definite tendency to cut into and enlarge the holes in the circuit board, thereby introducing excessive play and registration error between the circuit board and the artwork.

The use of solid, round locator pins eliminates some of the disadvantages of square locator pins. However, the circuit board tends to become stuck on round locator pins because of the tighter tolerances associated with round pins as compared with square pins. As a result, excessive time is required for the operator located at the load/unload station of the mechanized printer to separate the exposed circuit board from the glass artwork. It is not uncommon for the operator to insert a screwdriver or other prying instrument between the circuit board and the artwork in an attempt to separate them, often with resultant damage to the relatively fragile glass artwork. If slightly undersized round pins are used in order to facilitate board insertion and removal, there is inevitably excessive play between the artwork and circuit board, resulting in an inferior quality printing operation.

The present invention is directed to an improved locator pin for maintaining accurate registration between the circuit board and the printing mask, in that it permits quick insertion and removal of the circuit board from its printing position adjacent the printing mask while maintaining precise alignment between the circuit board and printing mask. The result is a much higher printing throughput by the mechanized circuit board printer.

SUMMARY OF THE INVENTION

It is therefore an object of the present invention to provide an improved apparatus for maintaining accurate registration between a circuit board and one or more printing masks.

It is also an object of the present invention to provide an improved locator pin in a circuit board print frame, which locator pin permits relatively fast insertion and removal of a circuit board to and from the print frame, while at the same time maintaining accurate registration between the circuit board and the printing mask.

These and other objects are achieved in accordance with a preferred embodiment of the invention by providing a locator pin comprising a base member secured to the print frame, an upright body member, formed as an integral part of the base member, whose interior is tapered inwardly towards the base member ending in a threaded opening in the base member, the body member having a plurality of annularly arranged slots, and a threaded expansion pin fitting into the body member for expanding the body member when the expansion pin is screwed into the body member.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 1 shows a side representation of a preferred embodiment of the locator pin of the present invention.

FIG. 2 shows a cross-sectional view of a preferred embodiment of the locator pin of the present invention.

FIG. 3 shows a top view of the upright body member portion of the locator pin of the present invention.

FIG. 4 shows a perspective representation of a printed circuit board print frame, including two locator pins according to a preferred embodiment of the present invention.

DETAILED DESCRIPTION OF THE INVENTION

FIG. 1 shows a side representation of the locator pin 10 according to a preferred embodiment of the present invention, including the base member 11, upright body member 12, and the upper portion of the expansion pin 13. The base member 11 and upright body member 12 are preferably cast as an integral unit. In the preferred embodiment the locator pin is made entirely of steel; however, other materials could obviously be used. The upright body member 12 of locator pin 10 contains a plurality of annularly arranged vertical slots 14, each slot 14 beginning in the lower part of body member 12 and extending upwardly through the upper portion of body member 12. Thus body member 12 essentially comprises a plurality of free-standing members separated by slots 14, each free-standing member being connected to the base member 11 by a flex point 15 having a concave exterior surface.

The upper portion of expander pin 13 may be slotted to accommodate a screwdriver tip. Alternatively, it may be knurled for manual adjustment, or it may have a straight knurl which will accommodate a conical-tipped screwdriver. Where a screwdriver is employed to tighten the expander pin 13, it is preferable to utilize a torque screwdriver, so that excessive tightening does not damage the locator pin 10 or those parts of the print frame 30 which fit over the locator pin 10 (see FIG. 4).

With reference to FIG. 2, a cross-sectional view of a preferred embodiment of locator pin 10 is shown, whereby the internal taper 16 of the upright body member 12 and the corresponding taper 17 of expander pin 13 may be seen. The internal taper 16 of the upright body member 12 slants downwardly and inwardly towards a threaded aperture 18 in the base member 11 of the locator pin 10. The lower portion 19 of expansion pin 13 bears threads matching those of threaded hole 18. When expansion pin 13 is screwed into threaded opening 18 in base member 11, the free-standing upright portions of body member 12 are forced outwardly into a greater cross-sectional area than when expansion pin 13 is not forcibly screwed into the threaded opening 18 in base member 11.

FIG. 3, which presents a top view of the body member 12 and base member 11, shows an opening 23 in base member 11 by means of which locator pin 10 may be secured with a screw to plate 31 of the print frame 30 (see FIG. 4).

FIG. 4 shows a perspective representation of a double-sided printed circuit board print frame incorporating a pair of locator pins 10 in accordance with a preferred embodiment of the present invention. Print frame 30 includes a first plate 31 and second plate 32 fastened along one edge thereof by means of hinges 41. The first plate 31 has a relatively large aperture 33 in its central portion over which artwork 34 in the form of a glass plate or plastic film is superimposed and fastened down. An artwork pattern typically comprises a number of lines 35 and other figures (not shown) representing a desired printed circuit pattern to be printed on printed circuit board 20. Printing mask 34 has a hole in two corners as shown, into which holes special bushings are inserted to accommodate the locator pins 10.

Similarly, the second plate 32 has a centrally located aperture 36 therein over which is secured a second printing mask 37, containing artwork 38 in the form of an image of conductive patterns to be printed on the opposite side of circuit board 20. Two holes 40 are located at two corners of printing mask 37 in the same relative location as the locator pins 10 secured to the first plate 31.

Circuit board 20 also contains a pair of holes 21 located in two corners thereof as shown in FIG. 4. The positioning of the pair of holes 21 in circuit board 20 relative to the pair of holes 40 in the second printing mask 37 and relative to locator pins 10 of plate 31 is critical, in that such holes must be in perfect alignment for precise registration between artwork patterns 35 and 38 of printing masks 34 and 37 respectively and circuit board 20. Any misalignment between either of printing masks 34 and 37 and the circuit board 20 will result in a defective printed circuit board.

In order to achieve perfect registration according to the present invention, the pair of holes 21 in circuit board 20 are first inserted over locator pins 10 of the first plate 31. Next the second plate 32 is lowered so that the pair of holes 40 therein fit over the pair of locator pins 10. Finally, the expander pins 13 are tightened, and precise registration is achieved.

With expander pin 13 loose, the upright body member 12 of the locator pin 10 will have a first cross-sectional area somewhat less than that of the holes 21 and 40, so that circuit board 20 and printing mask 37 may easily be lowered to and raised from the printing position. When the expansion pin 13 is tightened, the upright body member 12 has a second cross-sectional area at least as great as that of holes 21 and 40, so that the first and second plates 31 and 32 of print frame 30 and the circuit board 20 may be securely interlocked, thereby precluding any undesired relative movement between them.

It will be apparent to those skilled in the art that the disclosed Locator Pin For Aligning Printed Circuit Boards With Artwork may be modified in numerous ways and may assume many embodiments other than the preferred embodiment specifically set out and described above. For example, less than two locator pins may be used if suitable auxiliary stops or clamps are utilized. In certain configurations it may be desirable to use more than two locator pins. The present invention need not be used exclusively with a double-sided circuit board of the type shown in FIG. 4, but rather it may be used with other varieties of circuit boards, such as single-sided or multi-layered circuit boards.

Accordingly, it is intended for the appended claims to cover all modifications of the invention which fall within the true spirit and scope of the invention.

What is claimed is:

1. Apparatus for maintaining accurate registration between a circuit board on which a conductive pattern is to be formed and a printing mask containing the image of said conductive pattern, said apparatus comprising a plate having an exposure aperture therein, said printing mask being secured to said plate over said exposure aperture, and means affixed to said plate for detachably securing said circuit board to said plate to overlie said printing mask so that the portion of said circuit board on which said conductive pattern is to be formed is in accurate registration with said image on said printing mask, said securing means comprising a base member secured to said plate, an upright body member whose exterior is cylindrical and whose interior tapers inwardly from a free end towards said base and ends in a threaded opening therein, said body member being integral with said base and having a plurality of annularly spaced slots extending therethrough from said free end, and an expansion pin fitting into said body member, said pin being tapered along a portion therof and ending in a threaded portion, the tapered portion of said pin substantially matching the taper of the interior of said body member and the threaded portion of said pin matching the threaded opening in said base member, said expansion pin permitting said body member to assume a first cross-section when said expansion pin is not forcibly screwed into said body member and serving to expand said body member to a second cross-section when said expansion pin is forcibly screwed into said body member, said first cross-section being less than that of a predetermined opening in said circuit board so that said circuit board is easily moved relative to said body portion, and said second cross-section being at least as great as that of said opening, the relative locations of said securing means on said plate and said opening in said circuit board being such that said circuit board is maintained in accurate registration with said printing mask when said body member is expanded.

2. The apparatus according to claim 1, wherein said apparatus further comprises means for maintaining accurate registration between said circuit board and a second printing mask containing the image of a different conductive pattern to be printed on the opposite side of said board from which said first recited conductive pattern is printed, said means comprising a second plate having an exposure aperture therein, said second printing mask being secured to said second plate over said exposure aperture, said second plate having a predetermined opening therein of a diameter equal to that of the predetermined opening in the circuit board and in the same relative location therein, and means for hingeably securing said plates along one edge thereof, whereby one of said plates may be moved relative to the other to a first position where said circuit board may be inserted between said plates and to a second position where said circuit board may be locked into registration with said plates by tightening said expansion pin which fits through the holes of said circuit board and said second plate.

* * * * *